(12) United States Patent
Huang et al.

(10) Patent No.: US 10,847,521 B2
(45) Date of Patent: Nov. 24, 2020

(54) LAYOUT PATTERN OF A STATIC RANDOM ACCESS MEMORY

(71) Applicant: UNITED MICROELECTRONICS CORP., Hsin-Chu (TW)

(72) Inventors: Chun-Hsien Huang, Tainan (TW); Ching-Cheng Lung, Tainan (TW); Yu-Tse Kuo, Tainan (TW); Shu-Ru Wang, Taichung (TW); Chun-Yen Tseng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 36 days.

(21) Appl. No.: 16/152,423

(22) Filed: Oct. 5, 2018

(65) Prior Publication Data

US 2020/0083232 A1    Mar. 12, 2020

(30) Foreign Application Priority Data

Sep. 7, 2018  (TW) .............................. 107131430 A

(51) Int. Cl.
| | | |
|---|---|---|
| *H01L 27/02* | (2006.01) | |
| *H01L 27/11* | (2006.01) | |
| *H01L 29/78* | (2006.01) | |
| *H01L 29/08* | (2006.01) | |

(52) U.S. Cl.
CPC ...... *H01L 27/1104* (2013.01); *H01L 27/0207* (2013.01); *H01L 29/0847* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,294,212 B2 | 10/2012 | Wang et al. | |
| 2014/0185365 A1* | 7/2014 | Liaw | G11C 8/16 365/154 |
| 2017/0243861 A1* | 8/2017 | Wang | G06F 17/5068 |
| 2017/0256548 A1* | 9/2017 | Hsu | H01L 27/1052 |
| 2017/0323894 A1 | 11/2017 | Yeh et al. | |

* cited by examiner

*Primary Examiner* — Joseph C. Nicely
*Assistant Examiner* — Lamont B Koo
(74) *Attorney, Agent, or Firm* — Winston Hsu

(57) ABSTRACT

A layout pattern of a static random access memory (SRAM) preferably includes a first inverter and a second inverter. Preferably, the first inverter includes a first gate structure extending along a first direction on a substrate, in which the first gate structure includes a gate of a first pull-up device (PL1) and a gate of a first pull-down device (PD1). The second inverter includes a second gate structure extending along the first direction on the substrate, in which the second gate structure includes a gate of a second pull-up device (PL2) and a gate of a second pull-down device (PD2) and the gate of the PD1 is directly under the gate of the PD2.

14 Claims, 3 Drawing Sheets

LAYOUT PATTERN OF A STATIC RANDOM ACCESS MEMORY

BACKGROUND OF THE INVENTION

1. Field of the Invention

The invention relates to a layout pattern of a static random access memory (SRAM).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer system as a cache memory.

However in a typical SRAM layout pattern, the transmission path from a bit line to a voltage source such as Vss is usually far greater or far lesser than the transmission path from another bit line to another voltage source thereby affecting the resistance and performance of the device. Hence how to provide an improve layout pattern to resolve this issue under the same architecture has become an important task in this field.

SUMMARY OF THE INVENTION

According to an embodiment of the present invention, a layout pattern of a static random access memory (SRAM) preferably includes a first inverter and a second inverter. Preferably, the first inverter includes a first gate structure extending along a first direction on a substrate, in which the first gate structure includes a gate of a first pull-up device (PL1) and a gate of a first pull-down device (PD1). The second inverter includes a second gate structure extending along the first direction on the substrate, in which the second gate structure includes a gate of a second pull-up device (PL2) and a gate of a second pull-down device (PD2) and the gate of the PD1 is directly under the gate of the PD2.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
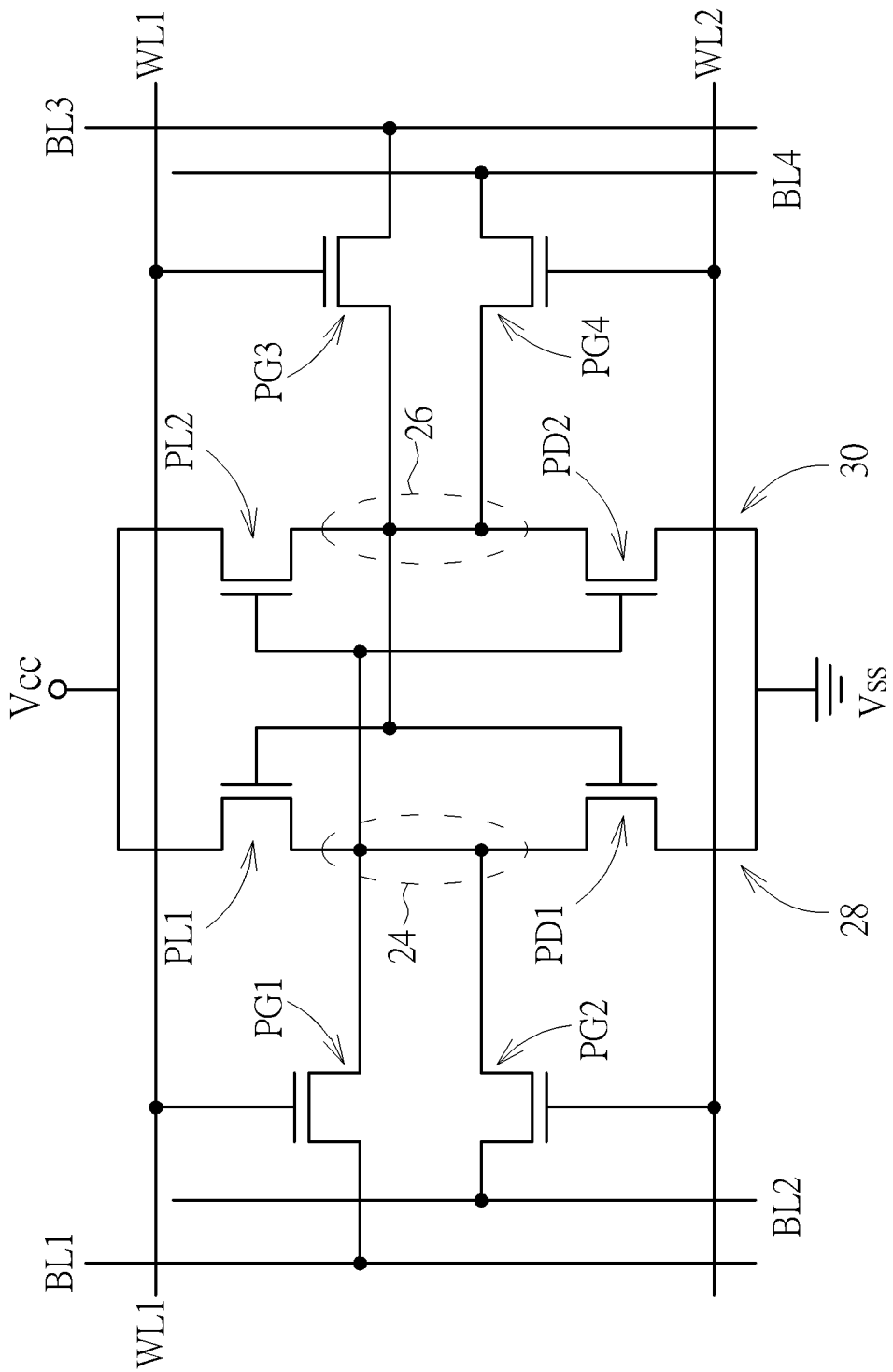
FIG. 1 illustrates a circuit diagram of an eight-transistor SRAM (8T-SRAM) cell according to an embodiment of the present invention.
Figure 2:
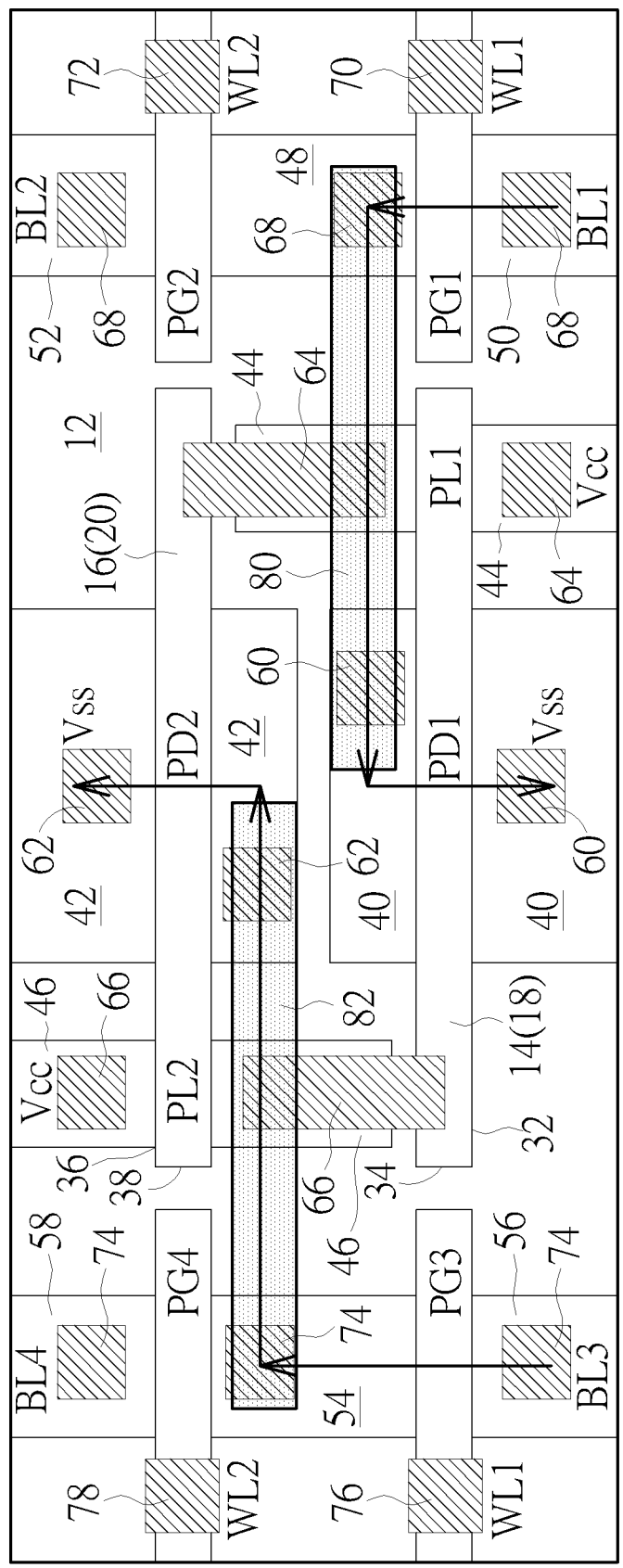
FIG. 2 illustrates a layout diagram of a 8T-SRAM according to an embodiment of the present invention.

Referring to FIGS. 1-2, FIG. 1 illustrates a circuit diagram of an eight-transistor SRAM (8T-SRAM) cell according to an embodiment of the present invention and FIG. 2 illustrates a layout diagram of a 8T-SRAM according to an embodiment of the present invention. As shown in FIGS. 1-2, the SRAM device of the present invention preferably includes at least one SRAM cell, in which each SRAM cell includes an eight-transistor SRAM (8T-SRAM) cell 10.

In this embodiment, each 8T-SRAM cell 10 is composed of a first pull-up device PL1, a second pull-up device PL2, a first pull-down device PD1, a second pull-down device PD2, a first pass gate device PG1, a second pass gate device PG2, a third pass gate device PG3 and a fourth pass gate device PG4. These eight transistors constitute a set of flip-flops. The first and the second pull-up devices PL1 and PL2, and the first and the second pull-down devices PD1 and PD2 constitute a latch circuit that stores data in the storage nodes 24 and 26. Since the first and the second pull-up devices PL1 and PL2 act as power load devices, they can be replaced by resistors. Under this circumstance, the static random access memory becomes a four-transistor SRAM (4T-SRAM). In this embodiment, the first and the second pull-up devices PL1 and PL2 preferably share a source/drain region and electrically connect to a voltage source (voltage node) Vcc, and the first and the second pull-down devices PD1 and PD2 share a source/drain region and electrically connect to a voltage source (voltage node) Vss.

Preferably, the first and the second pull-up devices PL1 and PL2 of the 8T-SRAM cell 10 are composed of p-type metal oxide semiconductor (PMOS) transistors and the first and the second pull-down devices PD1 and PD2, the first pass gate device PG1, the second pass gate device PG2, the third pass gate device PG3 and the fourth pass gate device PG4 are composed of n-type metal oxide semiconductor (NMOS) transistors, but not limited thereto. The first pull-up device PL1 and the first pull-down device PD1 together constitute an inverter, which further form a series circuit 28. One end of the series circuit 28 is connected to a voltage source Vcc and the other end of the series circuit 28 is connected to a voltage source Vss. Similarly, the second pull-up device PL2 and the second pull-down device PD2 constitute another inverter and a series circuit 30. One end of the series circuit 30 is connected to the voltage source Vcc and the other end of the series circuit 30 is connected to the voltage source Vss.

The storage node 24 is connected to the respective gates of the second pull-down device PD2 and the second pull-up device PL2. The storage node 24 is also connected to the drains of the first pull-down device PD1, the first pull-up device PL1, the first pass gate device PG1 and the second pass gate device PG2. Similarly, the storage node 26 is connected to the respective gates of the first pull-down device PD1 and first the pull-up device PL1. The storage node 26 is also connected to the drains of the second pull-down device PD2, the second pull-up device PL2, the third pass gate device PG3 and the fourth pass gate device PG4. The gates of the first pass gate device PG1 and the third pass gate device PG3 are respectively coupled to a first word line (WL1); the gates of the second pass gate device PG2 and the fourth pass gate device PG4 are respectively coupled to a second word line (WL2); the source of the first pass gate device PG1 is coupled to a first bit line (BL1); the source of the second pass gate device PG2 is coupled to a second bit line (BL2); the source of the third pass gate device PG3 is coupled to a third bit line (BL3); and the source of the fourth pass gate device PG4 is coupled to a fourth bit line (BL4).

Referring to FIG. 2, FIG. 2 illustrates a top view layout diagram of a SRAM according to an embodiment of the present invention. As shown in FIG. 2, the SRAM preferably includes a first inverter 14 and a second inverter 16 disposed on the substrate 12 and four pass gate devices PG1, PG2 PG3, PG4 disposed adjacent to two sides of the first inverter 14 and the second inverter 16. Preferably, the first inverter 14 includes a first gate structure 18 extending along a first direction (such as X-direction) on the substrate 12 and the first gate structure 18 further includes gate of the first pull-up device PL1 and gate of the first pull-down device PD1, and the second inverter 16 includes a second gate structure 20 extending along the same first direction on the substrate 12 and the second gate structure 20 further includes gate of the second pull-up device PL2 and gate of the second pull-down device PD2.

In this embodiment, the gate of the first pull-down device PD1 is directly under the gate of the second pull-down device PD2, the gate of the first pull-up device PL1 is on right side of the gate of the first pull-down device PD1, the gate of the second pull-up device PL2 is on left side of the second pull-down device PD2 so that the if viewed from a different angle the gate of the first pull-up device PL1 is on a diagonally opposite side of the gate of the second pull-up device PL2.

Preferably, the first gate structure 18 of the first inverter 14 includes a first long side 32 and a first short side 34 and the second gate structure 20 of the second inverter 16 includes a second long side 36 and a second short side 38, in which at least one short side 34 of the first gate structure 18 is aligned with the second short side 38 of the second gate structure 20, or two first short sides 34 of the first gate structure 18 could be aligned to two second short sides 38 of the second gate structure 20, which are all within the scope of the present invention.

Moreover, the gate of the first pass gate device PG1 is extended along the first direction on right side of the first inverter 14, the gate of the third pass gate device PG3 is extended along the first direction on left side of the first inverter 14, the gate of the second pass gate device PG2 is extended along the first direction on right side of the second inverter 16, and the gate of the fourth pass gate device PG4 is extended along the first direction on left side of the second inverter 16. In other words, the first pass gate device PG1 and the second pass gate device PG2 are disposed on the same side while the third pass gate device PG3 and the fourth pass gate device PG4 are disposed on the opposite side, in which the gate pattern of the first pass gate device PG1, the first gate structure 18, and the gate pattern of the third pass gate device PG3 are disposed in parallel and at least one long side of the gate pattern of the first pass gate device PG1 could be aligned with at least one long side of the gate pattern of the third pass gate device PG3. Similarly, the gate pattern of the second pass gate device PG2, the second gate structure 20, and the gate pattern of the fourth pass gate device PG4 are disposed in parallel and at least one long side of the gate pattern of the second pass gate device PG2 is aligned with at least one long side of the gate pattern of the second gate structure 20 and/or the gate pattern of the fourth pass gate device PG4.

Preferably the layout pattern of this embodiment also includes multiple doped regions or diffusion regions disposed in the substrate 12 adjacent to two sides of each gate pattern, including a doped region 40 adjacent two sides of the gate of the first pull-down device PD1 to serve as a source/drain region for the PD1, a doped region 42 adjacent to two sides of the gate of the second pull-down device PD2 to serve as a source/drain region for the PD2, a doped region 44 extending along a second direction (such as Y-direction) adjacent to two sides of the first pull-up device PL1 to serve as a source/drain region for the PL1, a doped region 46 extending along the second direction adjacent to two sides of the second pull-up device PL2 to serve as a source/drain region for the PL2, a doped region 48 extending along the second direction between the gate of the first pass gate device PG1 and the gate of the second pass gate device PG2 to serve as a common source/drain region for the PG1 and PG2, a doped region 50 on one side of the first pass gate device PG1 to serve as a source/drain region for the PG1, a doped region 52 on another side of the second pass gate device PG2 to serve as a source/drain region for the PG2, a doped region 54 extending along the second direction between the gate of the third pass gate device PG3 and the gate of the fourth pass gate device PG4 to serve as a common source/drain region between the PG3 and PG4, a doped region 56 on one side of the third pass gate device PG3 to serve as a source/drain region for the PG3, and a doped region 58 on another side of the fourth pass gate device PG4 to serve as a source/drain region for the PG4.

Viewing from an overall perspective, the doped region 40 is disposed directly under the doped region 42, the doped region 44 is disposed on one side of the doped region 40 and the doped region 46 is disposed on another side of the doped region 42, or the doped regions 44, 46 are disposed diagonally on opposite sides adjacent to two sides of the doped regions 40, 42.

Preferably, contact plugs are disposed on the doped regions 40, 42, 44, 46, 48, 50, 52, 54, 56, 58 and gate patterns to electrically connect to other elements. For instance, contact plugs 60 are disposed on the doped region 40 adjacent to two sides of the first pull-down device PD1, contact plugs 62 are disposed on the doped region 42 adjacent to two sides of the second pull-down device PD2, contact plugs 64 are disposed on the doped region 44 adjacent to two sides of the first pull-up device PL1, contact plugs 66 are disposed on the doped region 46 adjacent to two sides of the second pull-up device PL2, contact plugs 68 are disposed on the doped regions 48, 50, 52 adjacent to two sides of the first pass gate device PG1 and the second pass gate device PG2, contact plug 70 is disposed on the gate of the first pass gate device PG1, contact plug 72 is disposed on the gate of the second pass gate device PG2, contact plugs 74 are disposed on the doped regions 54, 56, 58 adjacent to two sides of the third pass gate device PG3 and fourth pass gate device PG4, contact plug 76 is disposed on the gate of the third pass gate device PG3, and contact plug 78 is disposed on the gate of the fourth pass gate device PG4. Preferably, the contact plug 68 disposed on one side of the first pass gate device PG1 is connected to the contact plug 60 adjacent to one side of the first pull-down device PD1 through metal interconnection 80 along the direction of arrows on the right side, and in similar manner the contact plug 74 disposed on one side of the third pass gate device PG3 is connected to the contact plug 62 disposed on one side of the second pull-down device PD2 through the metal interconnection 82 along the direction of arrows on the left side.

As shown in FIGS. 1-2, the doped region 40 is electrically connected to the voltage source Vss through the contact plugs 60, the doped region 42 is electrically connected to the voltage source Vss through the contact plugs 62, the doped region 44 is electrically connected to the voltage source Vcc through the contact plugs 64, the doped region 46 is electrically connected to the voltage source Vcc through the contact plugs 66, the doped region 50 is electrically connected to the bit line BL1 through the contact plug 68, the gate of the first pass gate device PG1 is electrically connected to the word line WL1 through the contact plug 70, the doped region 52 is electrically connected to the bit line BL2 through the contact plug 68, the gate of second pass gate device PG2 is electrically connected to the word line WL2 through the contact plug 72, the doped region 56 is electrically connected to the bit line BL3 through the contact plug 74, the gate of third pass gate device PG3 is electrically connected to the word line WL1 through the contact plug 76, the doped region 58 is electrically connected to the bit line BL4 through the contact plug 74, and the gate of fourth pass gate device PG4 is electrically connected to the word line WL2 through the contact plug 78.

It should be noted that in contrast to the transmission path or distance of transmission from one bit line to a voltage source Vss is usually significantly greater than or less than the transmission path from another bit line to the voltage source as in conventional SRAM cell, the present invention preferably places the two pull-down devices such as PD1 and PD2 in the relatively center location of the layout pattern while placing the two pull-up devices such as PL1 and PL2 on the adjacent two sides of the pull-down devices. By doing so, the transmission path from one bit line to a voltage source would be substantially equivalent to the transmission path from another bit line to the voltage source thereby reducing resistance of the device.

For instance, the transmission path or distance of transmission from the bit line BL1 on one side of the first pass gate device PG1 through the metal interconnection 80 to the voltage source Vss along the direction of arrows on the right would be substantially equivalent to the distance of transmission path from the bit line BL3 on one side of the third pass gate device PG3 through the metal interconnection 82 to the voltage source Vss along the direction of arrows on the left. It should also be noted that even though not labeled by the arrows, the distance of transmission from the bit line BL2 on one side of the second pass gate device PG2 through the metal interconnection 80 to the voltage source Vss would also be equivalent to the distance of transmission from the bit line BL4 on one side of the fourth pass gate device PG4 through the metal interconnection 82 to the voltage source Vss.

Preferably, the substrate 12 is a semiconductor substrate made of semiconductor material including but not limited to for example silicon, germanium, silicon-germanium compounds, silicon carbide, or gallium arsenide. The gate of each element could include conductive material such as metals, polysilicon, or silicide. Each of the doped regions 40, 42, 44, 46, 48, 50, 52, 54, 56, 58 could include n-type or p-type dopants and/or epitaxial material such as silicon germanium (SiGe), silicon carbide (SiC), or silicon phosphide (SiP) depending on the demand of the product.

According to an embodiment of the present invention, the metal interconnections 80, 82 could be embedded in an interlayer dielectric (ILD) layer and/or inter-metal dielectric (IMD) layer on top of the ILD layer according to a single damascene process or dual damascene process. Each of the metal interconnections 80, 82 could include a barrier layer and a metal layer, in which the barrier layer could be selected from the group consisting or titanium (Ti), titanium nitride (TiN), tantalum (Ta), and tantalum nitride (TaN) and the metal layer could be selected from the group consisting of tungsten (W), copper (Cu), aluminum (Al), titaniumaluminumalloy (TiAl), and cobalt tungsten phosphide (CoWP).

Figure 3:
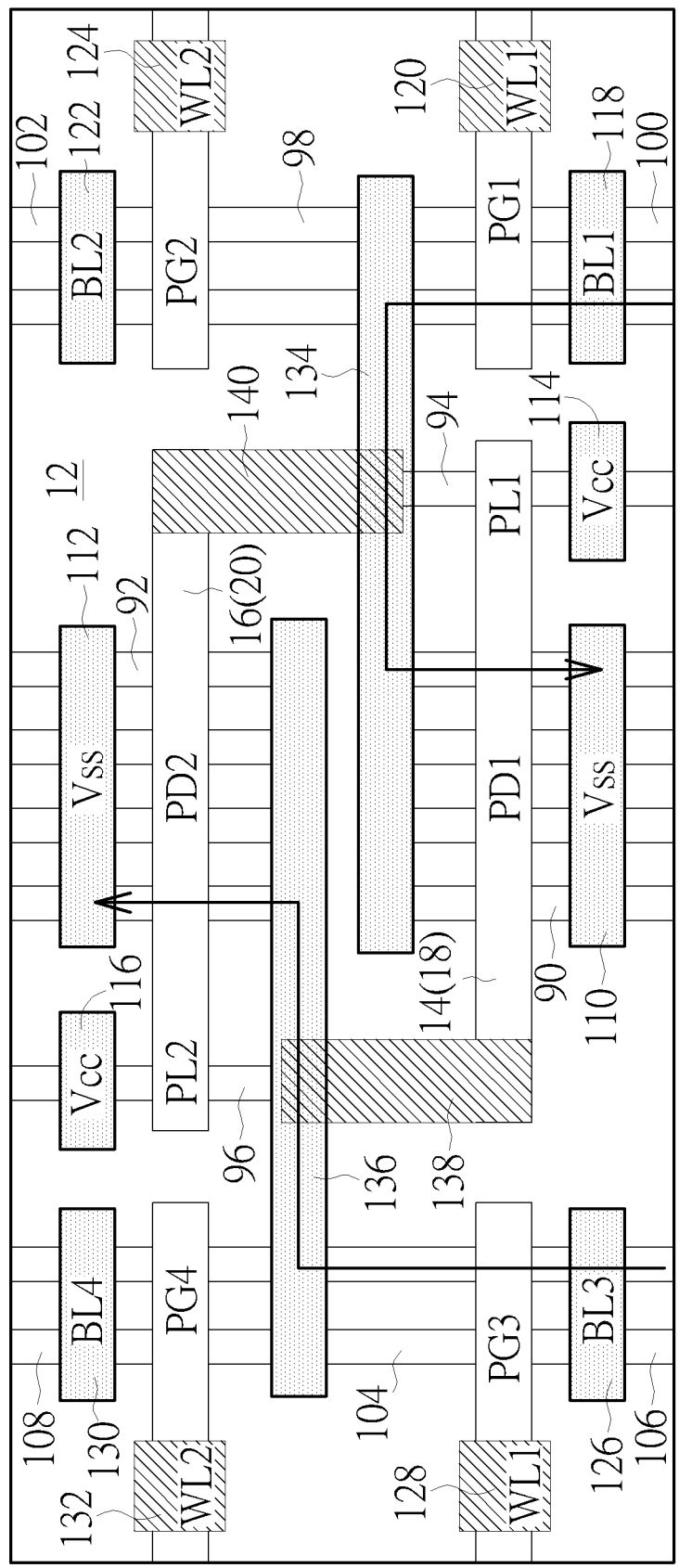
FIG. 3 illustrates a layout diagram of a 8T-SRAM according to an embodiment of the present invention.

Referring to FIG. 3, FIG. 3 illustrates a layout diagram of a SRAM cell according to an embodiment of the present invention. Similar to FIG. 2, the SRAM cell of this embodiment also includes a first inverter 14 and a second inverter 16 disposed on the substrate 12 and four pass gate devices PG1, PG2, PG3, PG4 adjacent to two sides of the first inverter 14 and second inverter 16, in which the first inverter 14 includes a first gate structure 18 extending along a first direction (such as X-direction) on the substrate 12 and the second inverter 16 includes a second gate structure 20 also extending along the same first direction on the substrate 12. Preferably, the first gate structure 18 further includes a gate of first pull-up device PL1 and a gate of first pull-down device PD1 and the second gate structure 20 further includes a gate of second pull-up device PL2 and a gate of second pull-down device PD2.

In contrast to the layout pattern shown in FIG. 2 includes multiple doped regions disposed in the substrate 12 adjacent to two sides of each of the gate patterns, a plurality of fin-shaped structures are disposed in the substrate 12 adjacent to two sides of each gate pattern in this embodiment. For instance, fin-shaped structures 90 extending along the second direction (such as Y-direction) adjacent to two sides of the gate of first pull-down device PD1 are disposed to serve as a source/drain region for the PD1, fin-shaped structures 92 adjacent to two sides of the second pull-down device PD2 are disposed to serve as a source/drain region for the PD2, fin-shaped structures 94 adjacent to two sides of the gate of first pull-up device PL1 are disposed to serve as a source/drain region for the PL1, fin-shaped structures 96 adjacent to two sides of the gate of second pull-up device PL2 are disposed to serve as a source/drain region for the PL2, fin-shaped structures 98 between the gate of first pass gate device PG1 and gate of second pass gate device PG2 are disposed to serve as a common source/drain region for the PG1 and PG2, fin-shaped structures 100 on one side of the first pass gate device PG1 are disposed to serve as a source/drain region for the PG1, fin-shaped structures 102 on another side of the second pass gate device PG2 are disposed to serve as a source/drain region for the PG2, fin-shaped structures 104 between the gate of third pass gate device PG3 and gate of fourth pass gate device PG4 are disposed to serve as a common source/drain region for the PG3 and PG4, fin-shaped structures 106 on one side of the third pass gate device PG3 are disposed to serve as a source/drain region for the PG3, and fin-shaped structures 108 on another side of the fourth pass gate device PG4 are disposed to serve as a source/drain region for the PG4.

According to an embodiment of the present invention, the fin-shaped structures 90, 92, 94, 96, 98, 100, 102, 104, 106, 108 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 90, 92, 94, 96, 98, 100, 102, 104, 106, 108 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Preferably, contact plugs or metal interconnections are disposed on the fin-shaped structures and gate patterns to electrically connect to other elements. For instance, the fin-shaped structures 90 are electrically connected to the voltage source Vss through metal interconnection 110, the fin-shaped structures 92 are electrically connected to the voltage source Vss through metal interconnection 112, the fin-shaped structures 94 are electrically connected to the voltage source Vcc through metal interconnection 114, the fin-shaped structures 100 are electrically connected to the bit line BL1 through metal interconnection 118, the gate of first pass gate device PG1 is electrically connected to word line WL1 through metal interconnection 120, the fin-shaped structures 102 are electrically connected to the bit line BL2 through metal interconnection 122, the gate of second pass gate device PG2 is electrically connected to word line WL2 through metal interconnection 124, the fin-shaped structures 106 are electrically connected to the bit line BL3 through metal interconnection 126, the gate of third pass gate device PG3 is electrically connected to word line WL1 through metal interconnection 128, the fin-shaped structures 108 are electrically connected to the bit line BL4 through metal interconnection 130, and the gate of fourth pass gate device PG4 is electrically connected to the word line WL2 through metal interconnection 132. Moreover, the fin-shaped structures 98 between the first pass gate device PG1 and the second pass gate device PG2 are electrically connected to the fin-shaped structures 90 on one side of the first pull-down device PD1 through metal interconnection 134, and similarly the fin-shaped structures 104 between the third pass gate device PG3 and fourth pass gate device PG4 are electrically connected to the fin-shaped structures 92 on one side of the second pull-down device PD2 through metal interconnection 136, in which the metal interconnection 136 is further electrically connected to the first inverter 14 through metal interconnection 138 while the metal interconnection 134 is electrically connected to the second inverter 16 through metal interconnection 140.

Similar to the layout shown in FIG. 2, the transmission path or distance of transmission from the bit line BL1 on one side of the first pass gate device PG1 through the metal interconnection 134 to the voltage source Vss along the direction of arrows on the right would be substantially equivalent to the distance of transmission path from the bit line BL3 on one side of the third pass gate device PG3 through the metal interconnection 136 to the voltage source Vss along the direction of arrows on the left. Moreover, it should be noted that even though not shown by the arrows, the distance of transmission from the bit line BL2 on one side of the second pass gate device PG2 through the metal interconnection 134 to the voltage source Vss would also be equivalent to the distance of transmission from the bit line BL4 on one side of the fourth pass gate device PG4 through the metal interconnection 136 to the voltage source Vss.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a static random access memory (SRAM), comprising:
    a first inverter comprising a first gate structure extending along a first direction on a substrate, wherein the first gate structure comprises a gate of a first pull-up device (PL1), a gate of a first pull-down device (PD1), a first long side, and a first short side; and
    a second inverter comprising a second gate structure extending along the first direction on the substrate, wherein the second gate structure comprises a gate of a second pull-up device (PL2), a gate of a second pull-down device (PD2), a second long side, and a second short side, the first short side is aligned with the second short side, the gate of the PD1 is directly under the gate of the PD2, a distance from the gate of the PD1 to the gate of the PD2 is less than a distance from the gate of the PL1 to the gate of the PL2, and the gate of the PD1 and the gate of the PD2 are between the gate of the PL1 and the gate of the PL2 while the gate of the PL1 is on a diagonally opposite side of the gate of the PL2.

2. The layout pattern of a SRAM of claim 1, further comprising:
    a gate of a first pass gate (PG1) device extending along the first direction on one side of the first inverter;
    a gate of a second pass gate (PG2) device extending along the first direction on one side of the second inverter;
    a gate of a third pass gate (PG3) device extending along the first direction on another side of the first inverter; and
    a gate of a fourth pass gate (PG4) device extending along the first direction on another side of the second inverter.

3. The layout pattern of a SRAM of claim 2, further comprising:
    a first doped region adjacent to two sides of the gate of the PD1; and
    a second doped region adjacent to two sides of the gate of the PD2.

4. The layout pattern of a SRAM of claim 3, wherein the first doped region is directly under the second doped region.

5. The layout pattern of a SRAM of claim 3, further comprising:
    a third doped region extending along a second direction adjacent to two sides of the gate of the PL1; and
    a fourth doped region extending along the second direction adjacent to two sides of the gate of the PL2.

6. The layout pattern of a SRAM of claim 5, wherein the third doped region is on one side of the first doped region and the fourth doped region is on another side of the first doped region.

7. The layout pattern of a SRAM of claim 2, further comprising a fifth doped region extending along a second direction between the gate of the PG1 and the gate of the PG2.

8. The layout pattern of a SRAM of claim 2, further comprising a sixth doped region extending along a second direction between the gate of the PG3 and the gate of the PG4.

9. The layout pattern of a SRAM of claim 2, further comprising:
- a first fin-shaped structure extending along a second direction adjacent to two sides of the gate of the PD1; and
- a second fin-shaped structure extending along the second direction adjacent to two sides of the gate of the PD2.

10. The layout pattern of a SRAM of claim 9, wherein the first fin-shaped structure is directly under the second doped region.

11. The layout pattern of a SRAM of claim 9, further comprising:
- a third fin-shaped structure extending along the second direction adjacent to two sides of the PL1; and
- a fourth fin-shaped structure extending along the second direction adjacent to two sides of the PL2.

12. The layout pattern of a SRAM of claim 11, wherein the third fin-shaped structure is on one side of the first doped region and the fourth fin-shaped structure is on another side of the first doped region.

13. The layout pattern of a SRAM of claim 2, further comprising a fifth fin-shaped structure extending along a second direction between the gate of the PG1 and the gate of the PG2.

14. The layout pattern of a SRAM of claim 2, further comprising a sixth fin-shaped structure extending along a second direction between the gate of the PG3 and the gate of the PG4.

* * * * *